United States Patent [19]
Matta et al.

[11] Patent Number: 5,162,975
[45] Date of Patent: Nov. 10, 1992

[54] INTEGRATED CIRCUIT DEMOUNTABLE TAB APPARATUS

[75] Inventors: Farid Matta, Mountain View; Kevin Douglas, San Mateo; Rajendra D. Pendse, Fremont; Brahram Afshari, Los Altos; Kenneth D. Scholz, Palo Alto, all of Calif.

[73] Assignee: Hewlett-Packard Company, Palo Alto, Calif.

[21] Appl. No.: 776,930

[22] Filed: Oct. 15, 1991

[51] Int. Cl.⁵ ............................................. H05K 7/20
[52] U.S. Cl. ............................... 361/386; 357/79; 357/81; 361/398; 439/73
[58] Field of Search .................. 357/79, 81; 174/52.2; 361/383, 386–388, 395, 398, 400, 396, 403, 412, 414, 421; 439/66, 67, 73, 74, 91, 485, 487, 492, 493, 591

[56] References Cited
U.S. PATENT DOCUMENTS

| | | | |
|---|---|---|---|
| 4,658,332 | 4/1987 | Berg | 361/387 |
| 4,731,693 | 3/1988 | Berg et al. | 361/386 |
| 4,887,147 | 12/1989 | Friedman | 357/81 |
| 5,053,922 | 10/1991 | Matta et al. | 361/386 |
| 5,065,279 | 11/1991 | Lazenby et al. | 361/398 |
| 5,065,280 | 11/1991 | Karnezos et al. | 357/79 |

*Primary Examiner*—Gregory D. Thompson
*Attorney, Agent, or Firm*—Howard R. Boyle

[57] ABSTRACT

The invention is embodied in a demountable TAB assembly. By using two springs in series, the present invention is able to maintain reliable contact between the TAB frame and the printed circuit board even if the elastomeric spring relaxes. The present invention also incorporates a novel TAB frame using contacts formed into an area-array. This area-array concept eliminated the need for fine line printed circuit board technology to support the TAB assembly.

6 Claims, 7 Drawing Sheets

INTEGRATED CIRCUIT DEMOUNTABLE TAB APPARATUS

BACKGROUND OF THE INVENTION

This invention relates to an apparatus for mounting an integrated circuit (IC) to a printed circuit board. In particular, this invention is embodied in a demountable tape automated bonded (DTAB) IC mounting device.

Every year, IC technology advances and the ICs designed and manufactured become more complex. Today, designers are designing and manufacturing ICs incorporating over 300,000 transistors. To fully utilize the capabilities of these highly complex ICs, the IC packaging technology must also keep pace. Large complex ICs require a large number of input and output (I/O) connections. An IC with a size of 0.5 inches square requiring 400 or more I/O connections is not uncommon.

One technology for mass-producing connections to ICs is called "Tape-automated bonding" (TAB) and is well known to persons ordinarily skilled in the electronics packaging art. TAB technology uses a continuous insulative tape to provide a planar support for IC chips that are attached to individual sections or frames of the tape. TAB frames are generally rectangular or square sections that are arranged side-by-side along an uncut tape. A spider-like metal pattern of conductive traces is formed on each frame. The traces radiate from the center of the frame to its four edges. An IC chip is attached to the center of the TAB frame so the leads or contacts of the chip are precisely mated with the corresponding metal traces in the central portion of the TAB frame. A TAB frame is mounted on a printed circuit board (PCB) thereby mating the metal traces of the TAB with metal traces on the PCB. The resulting assembly comprising the chip, the TAB frame and the PCB, is essentially a space transformer that employs diverging radial electrical pathways to afford ready access to the IC chip.

Conventional TAB technology is based on soldering the tape outer leads to the matching pattern on the PCB. This soldering operation is difficult to accomplish, and makes rework or repair of the PCB virtually impossible in production conditions. Therefore, there is a demand in the industry for an TAB attachment method that is easily reworkable and readily demountable.

A prior art demountable TAB system is disclosed in U.S. Pat. No. 4,658,331 to Berg. FIG. 1 shows the structure disclosed in the Berg patent. As shown in FIG. 1, an IC chip 102 is mounted on a TAB frame 114 and the TAB frame 114 is clamped onto a surface of the PCB 104 by elastomer pressure pads 112 and screws 110. The pressure pads 112 serve to bias the contacts (not shown) on the TAB frame 114 against the contacts (not shown) of the PCB 104. Extensions 116 of the TAB frame 114 are used to visually align the TAB frame 114 to the contacts (not shown) of the PCB 104. A heat spreader 140 is attached to the IC chip 2 to aid in heat dissipation.

The prior art demountable TAB system has significant drawbacks. To produce the necessary contact force between the contacts on the TAB frame 114 and the PCB 104, the elastomeric pressure pads 112 have to be compressed significantly. The uncompressed height of the elastomer is so great, that when the chip 102 is attached to the heat spreader 140, the TAB must take the form of an inverted truncated pyramid. As the four corners of the TAB frame are typically held fixed to the PCB by mounting hardware, raising the center of the TAB frame to form a pyramid shape subjects the TAB frame to high stresses and curling and causes the loss of alignment to the underlying PCB 104.

To reduce the stress forces a TAB frame is subjected to, the elastomer spring height could be reduced. However, a significant reduction in the uncompressed height of the elastomer is not possible since the spring force becomes too small to be controllable. If the amount of compression is small, for example 10 mils, then a small variation of 1-2 mils, resulting from the bending of the heat spreader under load, causes a 10-20% loss of contact force. Such an assembly is likely to fail during thermal cycling caused by the IC chip heating up and cooling off during use.

The prior art demountable TAB system does not lend itself well to repeated mounting operations. After the mounting system has been in use and subjected to thermal aging or cycling, the elastomer tends to take a set. The elastomer will no longer return to the original height once the clamping force is removed. As such, the bias force supplied by the elastomer will decrease. Also, the elastomer will become imprinted with the TAB contact pattern and will not supply an even bias force to the TAB contacts if reused.

Another drawback of the prior art demountable TAB is the use of tape extensions 116 to align the TAB frame 114 with the PCB 104. This method requires a larger and more expensive TAB frame than is required for the TAB frame contacts alone and requires sophisticated optical alignment equipment.

A drawback of all the prior art TAB systems is the mandated use of fine line PCBs for high lead count applications. Fine line PCB technology refers to the use of PCB traces that are spaced apart by less than about 0.02 inches. If the traces are spaced less than 0.02 inches, the PCB manufacturing processes must be tightly controlled. The tighter the process must be controlled, the more costly are the PCBs.

FIG. 2 shows one of four sides of a prior art TAB peripheral edge 202 and a mating PCB contact pattern 204. Each PCB connection 208 is spaced apart from the adjacent connection 208 by approximately 0.01 inches and is typically connected to a through hole 206. The through holes 206 are spaced apart by approximately 0.1 inches and are arranged in a grid 210. This grid 210 of through holes is required to permit software currently used in the industry to route the PCB connections to various locations on the PCB. No matter how small the TAB assembly is physically, the effective PCB area occupied by the TAB assembly is defined by the through hole grid 210. So, while the PCB area needed for the TAB hardware is defined by the through holes spaced 0.1 inches apart, the TAB frame must be precisely aligned to the PCB contacts that are spaced 0.01 inches apart, a difficult task.

With the above in mind, a need exists in the industry for a reusable TAB mounting assembly that is reliable, can withstand repeated thermal cycling and eliminates the need for fine line PCBs and the tedious optical alignment of the TAB frame to the PCB.

SUMMARY OF THE INVENTION

The present invention is embodied in a reliable demountable TAB assembly that eliminates the need for expensive, hard to produce, fine line printed circuit boards or precision optical alignment and is unaffected by repeated thermal cycling.

The need for fine line PCB is eliminated by providing, on a TAB frame, traces that terminate in an area array (contacts spaced approximately 0.01 inches center-to-center). This area array consists of contacts arranged in a grid pattern to match a grid of contacts, similarly spaced, on a PCB. Consolidating the fine line traces and close tolerance processes to the TAB frame adds minimal cost to the TAB frame while saving considerable PCB cost.

Additionally, aligning larger contacts spaced 0.1 inches apart, as in the present invention, is easier than aligning smaller contacts spaced 0.01 inches apart as in the prior art. In the present invention, the TAB-to-PCB alignment is accomplished by having four protruding bosses in the TAB package and a matching set of four holes in the PCB. The result is a self-aligned structure requiring no special tools or procedures.

To overcome the elastomer stress relaxation problem of the prior art TAB assemblies, in some embodiments of the present invention, the bias force is supplied totally, or in part, by a spring located on the backside of the PCB (opposite the TAB side). A spring located on the backside of the PCB is not subjected to the heat from the IC chip located on the TAB frame. Also, the height and size of the spring is less critical as the spring will not interfere with the TAB assembly or other parts located on top of the PCB.

In one embodiment of the present invention, two springs are used to supply the required contact bias force. A first spring, typically elastomeric, is located adjacent to the TAB frame and serves as a planarizer to accommodate minor variations in the topology of the TAB frame or the PCB. A second spring, located on the backside of the PCB, supplies a substantial portion of the contact bias force. This two spring arrangement provides the contact bias force necessary for a reliable TAB assembly even if the first spring relaxes significantly.

In another embodiment of the present invention, a "U" or "C" shaped metal spring is used in place of the elastomeric spring/planarizer. This metal spring is not subject to relaxation and therefore provides for reliable TAB frame to PCB contact force.

A TAB mounting system combining a contact biasing spring located on the backside of a PCB with a TAB frame constructed with an area array provides a novel and useful device to the electronics packaging industry.

DETAILED DESCRIPTION OF THE INVENTION

Figure 1:
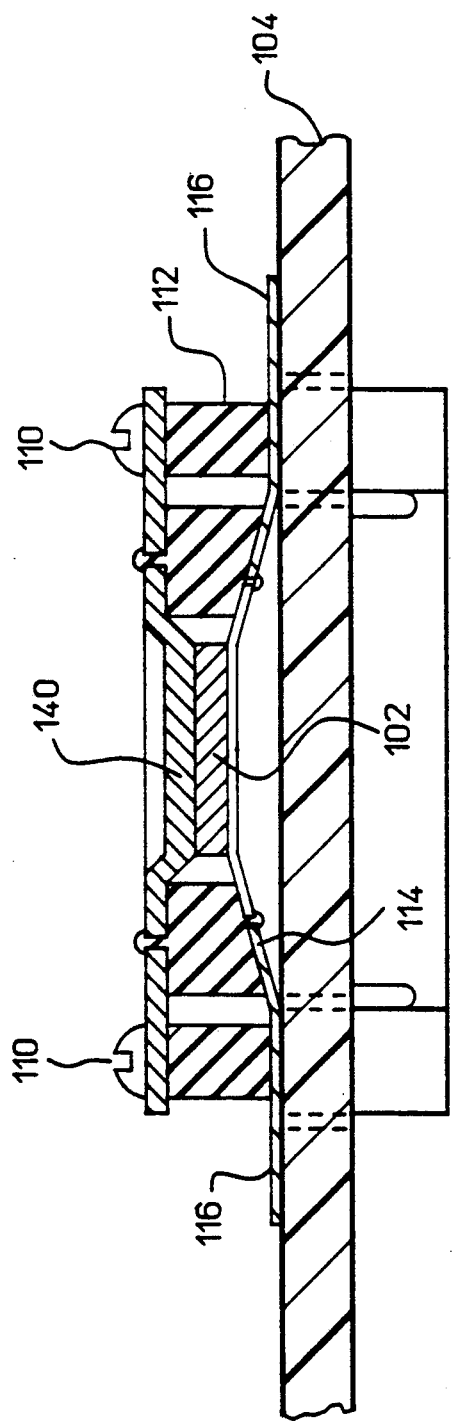
FIG. 1 is a cross-sectional view of a prior art TAB mounting assembly.
Figure 2:
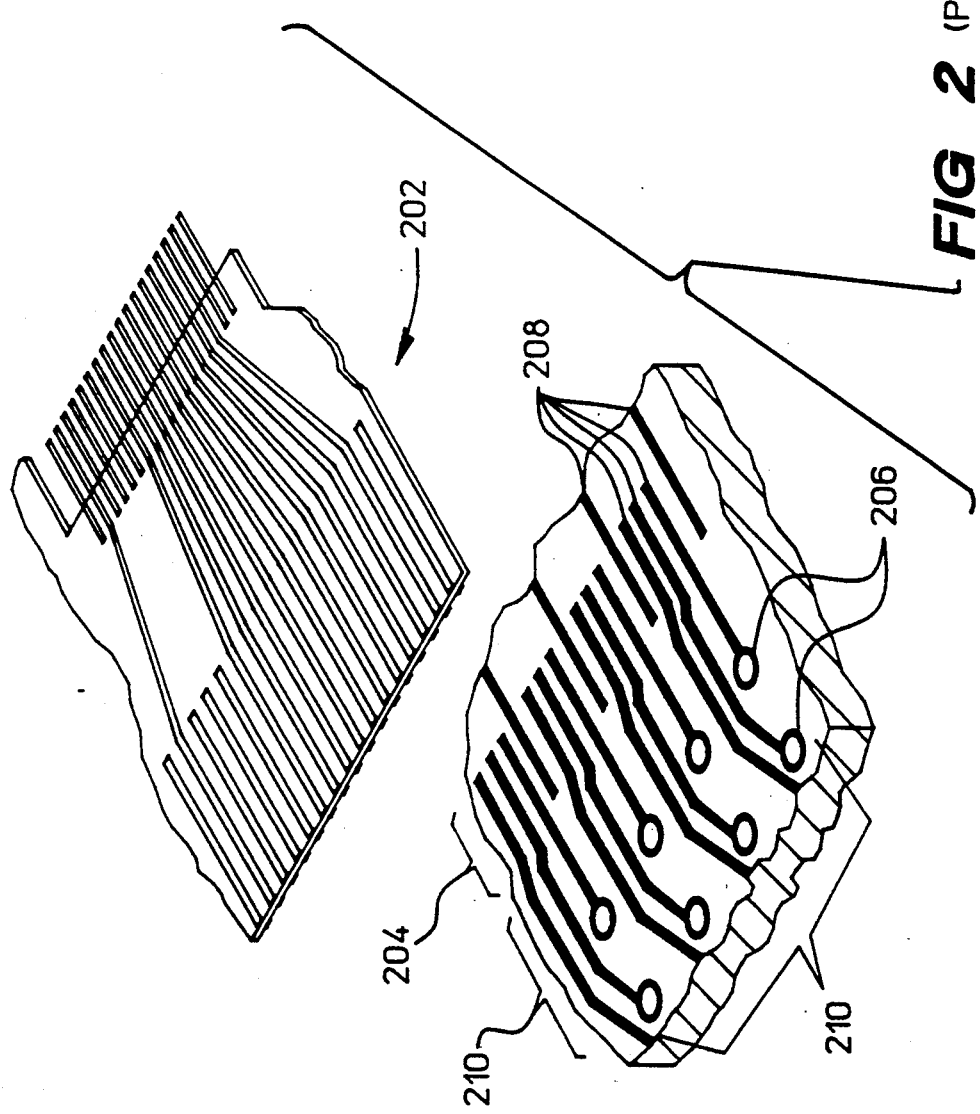
FIG. 2 is a perspective view of a group of prior art TAB frame peripheral contacts and a group of prior art PCB contacts.
Figure 3:
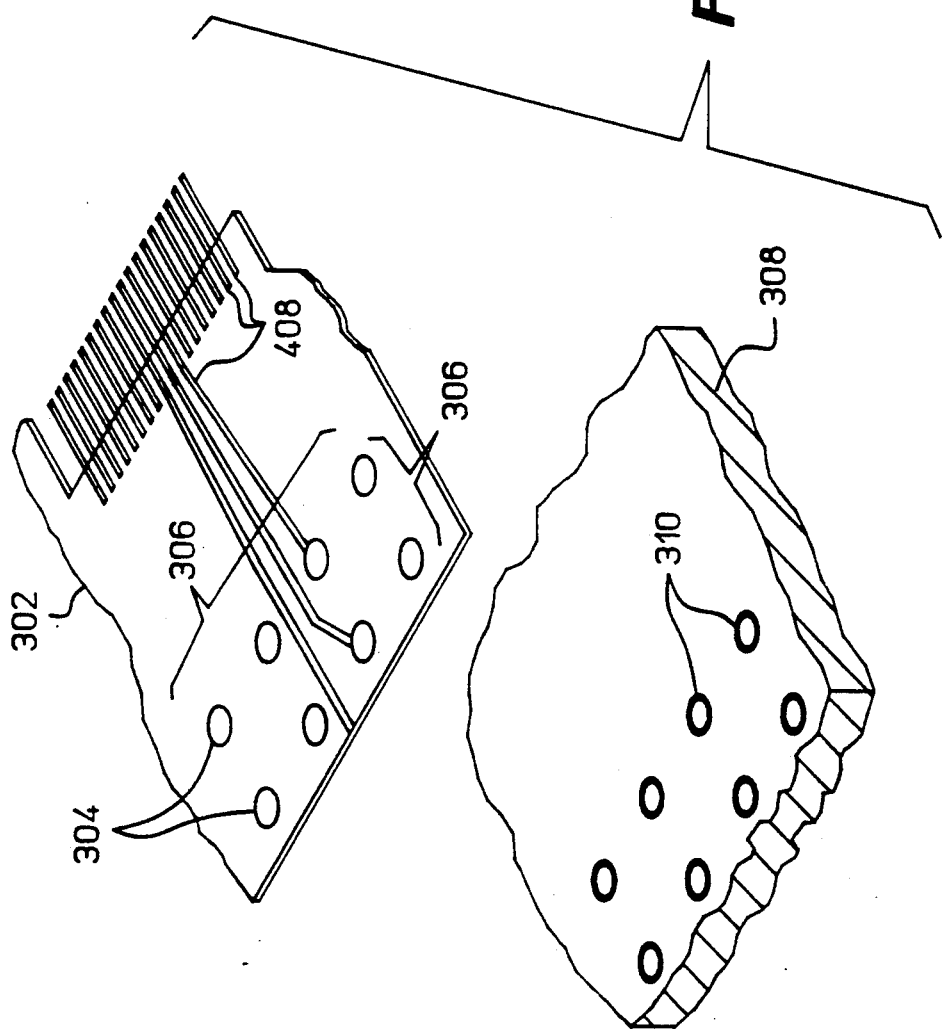
FIG. 3 is a perspective view of a portion of a TAB frame area-array and mating contacts on a PCB in accordance with a preferred embodiment of the invention.
Figure 4:
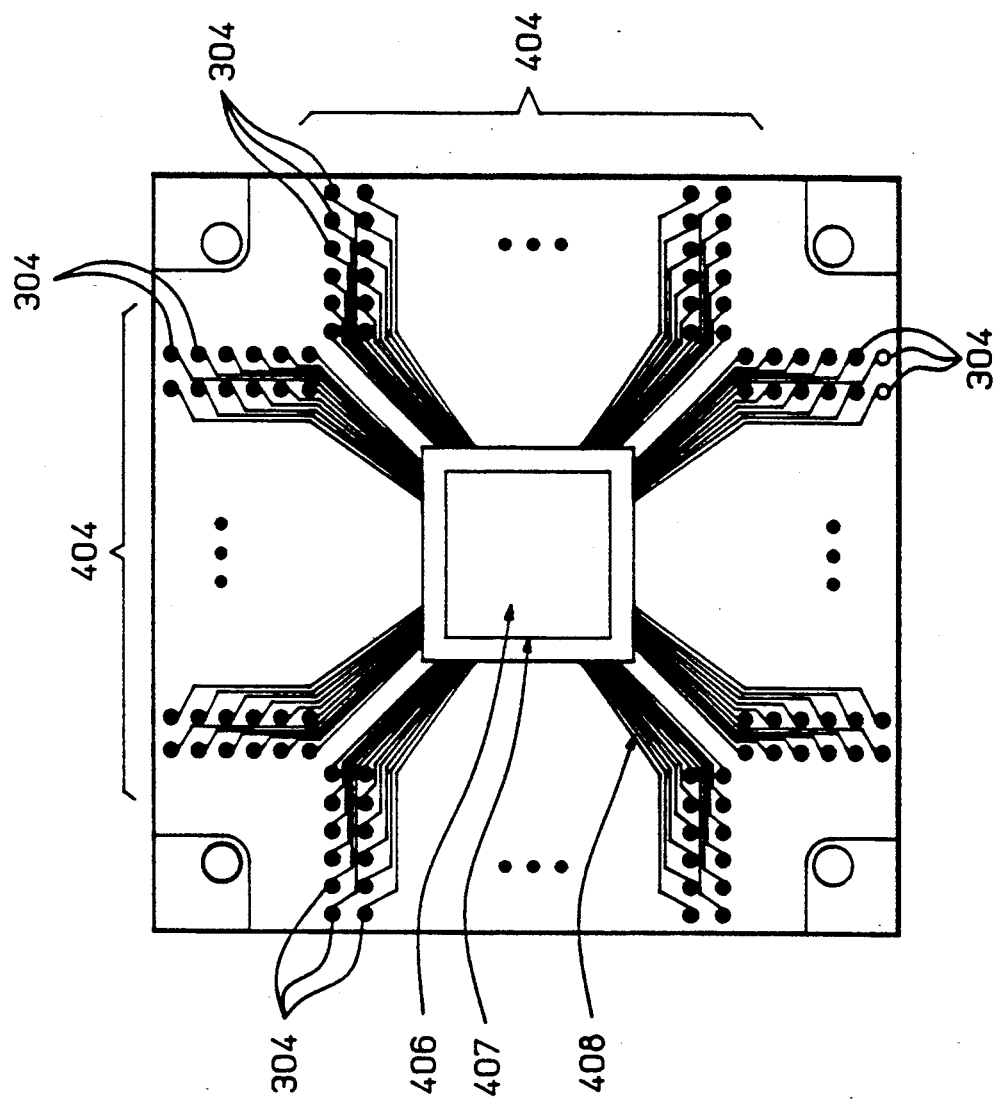
FIG. 4 is a bottom view of a TAB frame manufactured with area-array contacts in accordance with the present invention.

The present invention is manifested in a demountable TAB assembly. One embodiment of a TAB frame, according to the present invention, is shown in FIGS. 3 and 4. FIG. 3 shows a portion of the TAB frame 302 with contacts 304 spaced to form an area-array 306. A portion of a PCB 308 is also shown with through holes 310. The through holes 310 are spaced such that they are in positional alignment with the contacts 304 in the TAB frame 302.

FIG. 4 shows one embodiment of a complete TAB frame 302 for illustrative purposes. The contacts 304 are shown formed into an area-array 404. An IC chip 406 is mounted in the center of the TAB frame 302 and attached to the leads 408 of the frame 302 by one of the well known process in the art, for example, thermocompression bonding. The IC chip 406 is also coated with an encapsulant 407 subsequent to the inner lead bonding operation.

Figure 5:
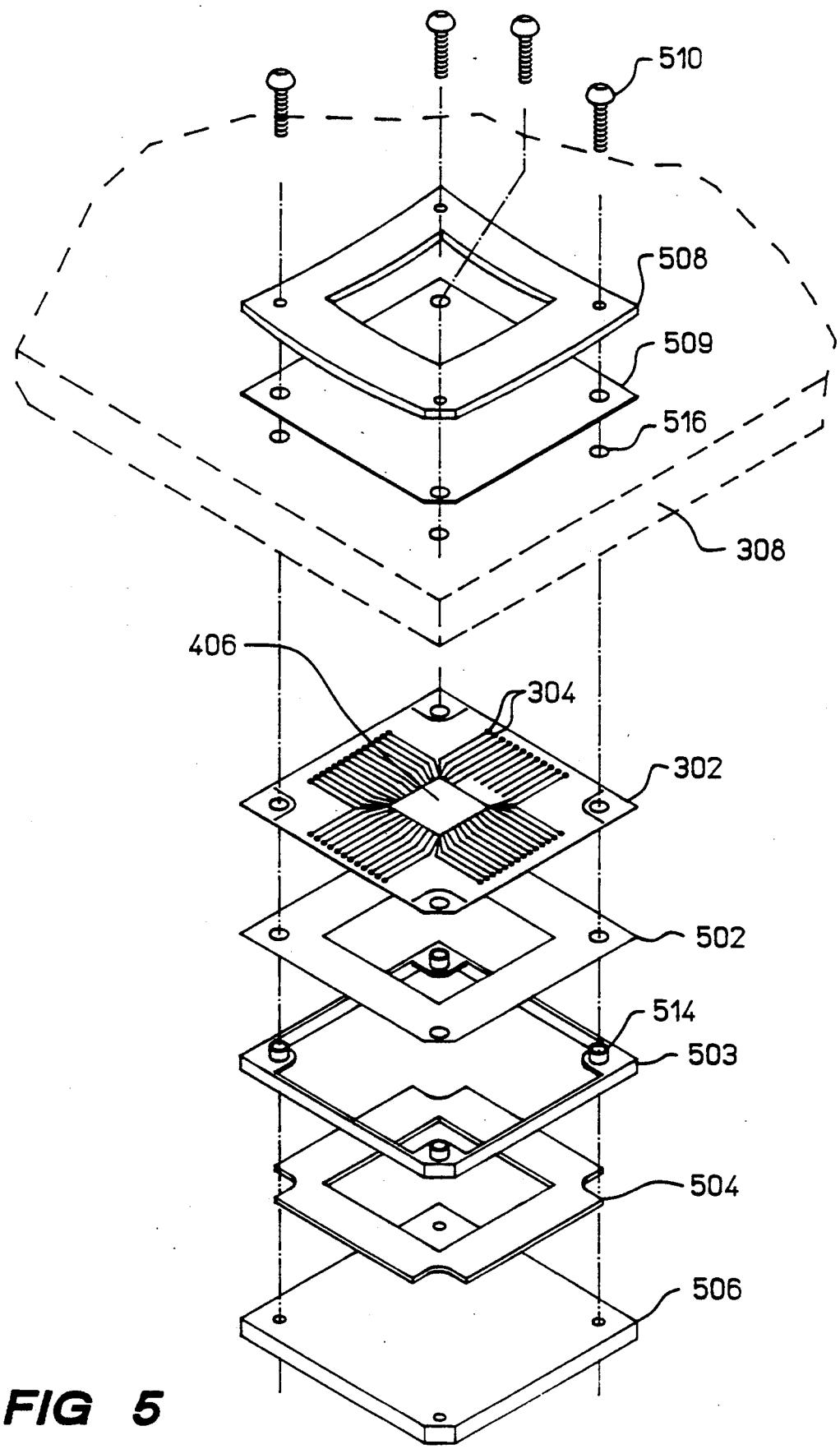
FIG. 5 is a cross-sectional view of a TAB mounting assembly according to the present invention.

As shown in FIG. 5, an IC chip 406 is mounted on a TAB frame 302 that is mounted on a PCB 308. A thin stainless steel membrane 502 is disposed between the top of the TAB frame 302 and an elastomeric planarizer 504 made of silicon rubber approximately 40 mils thick. Positioned on top of the elastomeric planarizer 504, and in thermal contact with the IC chip 406, is a heat spreader 506. Located below the PCB 308 (opposite side of the TAB frame) is an insulator 509 and a curved spring 508 made from spring steel approximately 62 mils thick. Screws 510 pass through the spring 508, insulator 509, PCB 308, TAB frame 302, membrane 502, elastomer planarizer 504 and thread into the heat spreader 506. An alignment frame 503 includes protruding bosses 514 and serves to align the TAB frame, planarizer, membrane and heat spreader. The bosses 514 are inserted into holes 516 in the PCB 308 to assure alignment of the TAB frame contacts with the PCB contacts.

As the screws 510 are threaded into the heat spreader 506, elastomeric planarizer/spring 504 is compressed to approximately 38 mils thick and the curved spring 508 is flattened, thereby forcing the TAB frame 302 into contact with the PCB 308. As the curved spring 508 is compressed, the center of the spring 508 slightly bows the PCB 308 thereby compensating for any bowing of the heat spreader 506.

When two springs are connected in series, as are elastomeric planarizer/spring 504 and spring 508, the overall spring constant is $K = K1*K2/(K1+K2)$, where K1 and K2 are the spring constants of the individual springs. If one of the springs, for example K1, relaxes by a factor of M, the overall spring constant relaxes by a factor of N, where $N = M(1+K)/(M+K)$.

Therefore, by choosing the appropriate spring ratio of K2/K1, the reduction in the overall spring constant, resulting from the relaxation of one of the springs is limited. In the present invention, the spring constants are chosen to provide an acceptable contact bias force even if the elastomeric planarizer/spring 504 relaxes from, for example, thermal setting. This advantage was not available in the prior art assemblies.

The membrane 502 is approximately 1-2 mils thick and serves to prevent imprinting of the TAB frame profile into the elastomer planarizer 504 and to prevent sagging of the TAB frame 302 tape between the TAB frame contacts. The membrane 502 transfers the relatively uniform applied load from the elastomer planarizer 504 to the regions of the TAB frame supported by the contacts 304. While the membrane 502 is made out of stainless steel in the preferred embodiment, other metals and thicknesses could be used.

In the preferred embodiment, the curved spring 508 is fabricated as a section of a sphere. For a two inch square TAB frame containing 432 contacts, the spring 508 exerts approximately 600 pounds of force when compressed and has an uncompressed height, measured from the lowest point to the highest point of approximately 17 mils. The stroke of the spring 508 is long enough to compensate for the elastomer spring relaxation of approximately 3-4 mils. This sphere shape forces the center of the PCB up toward the IC thereby insuring contact between the IC chip and the heat spreader.

One skilled in the art could make the curved spring in a different shape. For example, the spring could be made such that it curved in one or two directions instead of as a section of a sphere. A bellville washer, well known in the art, could also be used.

Figure 6:
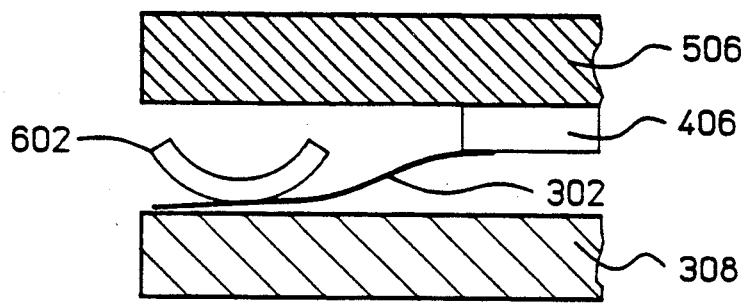
FIG. 6 is a cross-sectional view of a TAB mounting assembly according to the present invention utilizing a "C" spring.
Figure 7:
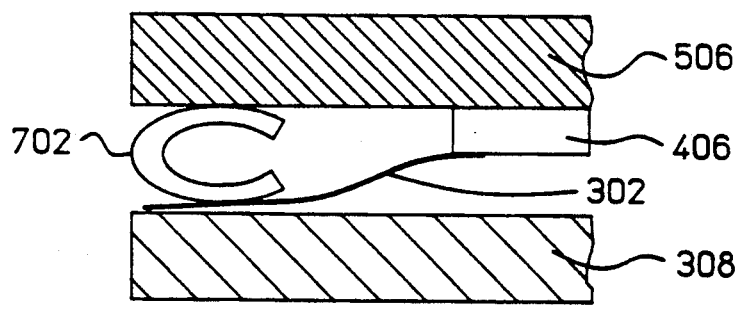
FIG. 7 is a modification of the embodiment of FIG. 6 utilizing a "U" spring.

FIGS. 6 and 7 show embodiments of the present invention where the elastomeric planerizer/spring has been replaced with a metal spring. In FIG. 6, a "U" shaped metal spring 602, manufactured from beryllium copper, is located between the TAB frame 302 and the heat spreader 506. The spring 602 forces the TAB frame 302 against the PCB 308. Since the spring 602 is metal, the spring 602 will not be subject to imprinting by the TAB frame profile and will not relax appreciably under the influence of time or heat.

FIG. 7 shows an embodiment of the present invention where a "C" shaped metal spring 702, manufactured from 5 mil thick beryllium copper, is located between the TAB frame 302 and the heat spreader 506. This spring 702 biases the TAB frame 302 against the PCB 308. The structures shown in FIGS. 6 and 7 are appropriate for demountable TAB packages having a single row of peripheral contacts.

While springs 602 and 702 are manufactured of beryllium copper in the preferred embodiments, it will be apparent to one skilled in the art that other metals could be used.

Figure 8:
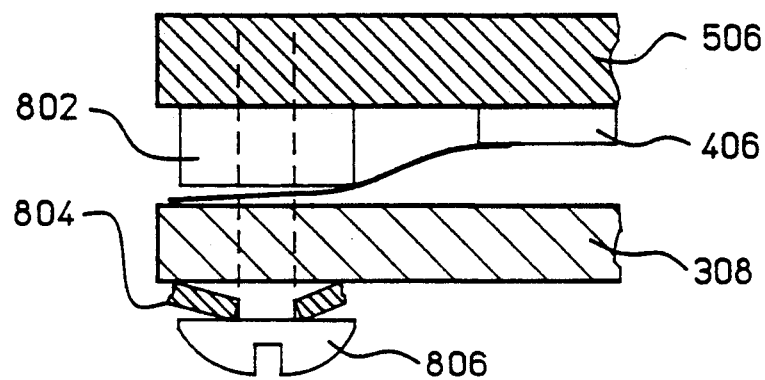
FIG. 8 is a cross-sectional view of an embodiment of the present invention utilizing a spacer.
Figure 9:
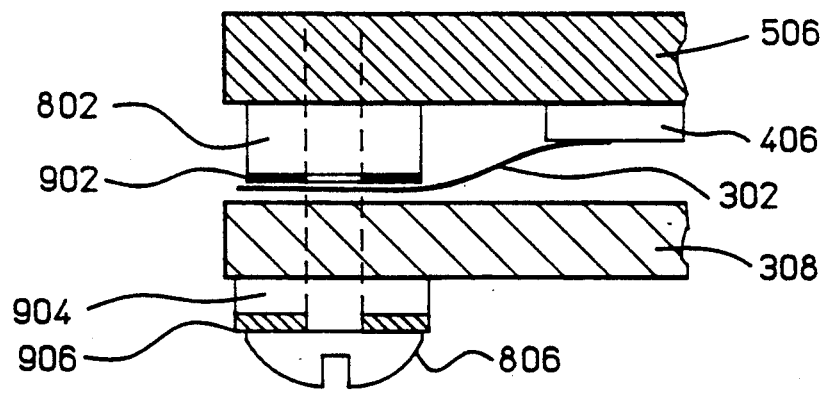
FIG. 9 is a modification of the embodiment of FIG. 8 utilizing an elastomer spring and an elastomer gasket.

FIGS. 8 and 9 show embodiments of the present invention where a single spring, located on the opposite side of the PCB from TAB frame, is used to provide the TAB frame bias force. In FIG. 8, a spacer 802 is located between the TAB frame 302 and the heat spreader 506. The height of the spacer 802 is approximately the same height as the IC chip 406 mounted on the TAB frame 302. A screw 806 passes through a spring 804, the PCB 308, the TAB frame 302, the spacer 802 and threads into the heat spreader 506. As the screw is threaded into the heat spreader 506, the TAB frame is clamped onto the PCB 308. The screw 806 is kept tight by the tension provided by the spring 804.

The embodiment of the present invention shown in FIG. 9 is a variation of the embodiment shown in FIG. 8. In FIG. 9, TAB frame bias force is provided by an elastomer spring 904 and the spring 904 is isolated from the screw 806 by a plate 906. The plate 906 prevents the screw 806 from damaging the elastomer spring 904. Since the elastomer spring 904 is isolated from the IC chip 406, the spring 904 is not subjected to severe thermal cycling. The spacer 802 described and shown in FIG. 8 is modified as shown in FIG. 9 to include a thin elastomer gasket 902. This gasket 902 will accommodate minor variations in the profile of the TAB frame of the PCB.

While preferred embodiments of the present invention have been described above, it is intended that all matter contained in the above descriptions and shown in the accompanying drawings be interpreted as illustrative and not in a limiting sense and all modifications, constructions and arrangements which fall within the scope of the invention be determined solely from the following claims.

We claim:

1. A TAB frame mounting apparatus for mounting a TAB frame onto a printed circuit board, said TAB frame having a lower surface in contact with said printed circuit board and said TAB frame also having an upper surface, comprising:
    a first spring means adapted for placement on said upper surface of said TAB frame;
    a second spring means adapted for placement on the opposite side of said printed circuit board from said TAB frame; and
    a clamping means operative to compress said first and second spring means such that said TAB frame is adapted to be forced into contact with said printed circuit board when said printed circuit board is located between said lower surface of the TAB frame and said second spring means,
    said second spring means compensates for any relaxation effect in said first spring means.

2. An apparatus as in claim 1 wherein the clamping means includes an integral heat spreader.

3. An apparatus as in claim 1 wherein the first spring means includes an elastomeric material.

4. An apparatus as in claim 1 wherein the second spring means includes a curved spring.

5. An apparatus as in claim 1 wherein the second spring means includes a bellville washer.

6. An apparatus as in claim 1 wherein the first spring means includes a membrane.

* * * * *